(12) United States Patent
Lim et al.

(10) Patent No.: US 10,986,727 B2
(45) Date of Patent: Apr. 20, 2021

(54) METHOD AND APPARATUS FOR FABRICATING A STRETCHABLE ELECTRONIC ELEMENT

(71) Applicant: ELECTRONICS AND TELECOMMUNICATIONS RESEARCH INSTITUTE, Daejeon (KR)

(72) Inventors: Jong Tae Lim, Seoul (KR); Seung Youl Kang, Daejeon (KR); Jae Bon Koo, Daejeon (KR); Seongdeok Ahn, Daejeon (KR); Jeong Ik Lee, Daejeon (KR); Bock Soon Na, Daejeon (KR); Hyunkoo Lee, Daejeon (KR); Sung Haeng Cho, Cheongju-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 111 days.

(21) Appl. No.: 16/220,568

(22) Filed: Dec. 14, 2018

(65) Prior Publication Data
US 2019/0327828 A1    Oct. 24, 2019

(30) Foreign Application Priority Data

Apr. 24, 2018 (KR) ........................ 10-2018-0047540

(51) Int. Cl.
*H05K 1/02* (2006.01)
*H01L 21/203* (2006.01)
(Continued)

(52) U.S. Cl.
CPC ......... *H05K 1/0283* (2013.01); *B32B 37/144* (2013.01); *H01L 21/203* (2013.01); *H01L 21/6835* (2013.01)

(58) Field of Classification Search
None
See application file for complete search history.

(56) References Cited

U.S. PATENT DOCUMENTS 8,865,505 B2   10/2014  Nakahama et al.
8,965,765 B2    2/2015  Zweig et al.
(Continued)

FOREIGN PATENT DOCUMENTS

KR   10-2014-0133675 A   11/2014
KR   10-2017-0033753 A    3/2017
KR      10-1715501 B1     3/2017

OTHER PUBLICATIONS

Zhengwei Li et al., "Mechanics of curvilinear electronics and optoelectronics", Current Opinion in Solid State and Materials Science, vol. 19, pp. 171-189, 2015.
(Continued)

*Primary Examiner* — Christopher T Schatz
(74) *Attorney, Agent, or Firm* — Rabin & Berdo, P.C.

(57) ABSTRACT

According to an exemplary embodiment of the present invention, by providing an apparatus for fabricating a stretchable electronic element including a chamber, a plurality of sample portions loaded into the chamber and spaced apart from each other, while the chamber is maintained at atmospheric pressure, and a movable member moving the plurality of sample portions and compressing each of the plurality of sample portions together while the chamber is kept under vacuum, it is possible to fabricate variable stretchable electronic elements.

14 Claims, 14 Drawing Sheets

(51) Int. Cl.
 H01L 21/683 (2006.01)
 B32B 37/14 (2006.01)

(56) References Cited

U.S. PATENT DOCUMENTS

| | | | |
|---|---|---|---|
| 2010/0238636 A1* | 9/2010 | Mascaro | H05K 3/143 |
| | | | 361/750 |
| 2011/0186239 A1* | 8/2011 | Lai | B32B 43/00 |
| | | | 156/583.1 |
| 2013/0336459 A1 | 12/2013 | Choi et al. | |
| 2017/0097315 A1 | 4/2017 | Lee et al. | |

OTHER PUBLICATIONS

Martin Kaltenbrunner et al., "Ultrathin and lightweight organic solar cells with high flexibility", Nature Communications, pp. 1-7, Apr. 3, 2012.
Michael Melzer et al., "Imperceptible magnetoelectronics", Nature Communications, pp. 1-8, Jan. 21, 2015.

* cited by examiner

METHOD AND APPARATUS FOR FABRICATING A STRETCHABLE ELECTRONIC ELEMENT

CROSS-REFERENCE TO RELATED APPLICATION

This application claims priority to and the benefit of Korean Patent Application No. 10-2018-0047540 filed in the Korean Intellectual Property Office on Apr. 24, 2018, the entire contents of which are incorporated herein by reference.

BACKGROUND OF THE INVENTION

(a) Field of the Invention

The present invention relates to a method and apparatus for fabricating stretchable electronic elements.

(b) Description of the Related Art

As a conventional art for implementing a stretchable electronic element, a method of fabricating a highly stretchable structure is mainly used. In a typical conventional art, a technique for transferring an electronic circuit containing an electronic element and a wiring unit to the surface of a pre-stretched stretchable substrate and remove stress to return the substrate to its original state, to induce buckling of the electronic element and metal wiring layers and to ensure the stretchability of the electronic circuit from the implemented wavy structure, is used. However, no technique has been proposed to pattern the stretchable region of stretchable electronic elements in the conventional art.

In the case where a vacuum stretchable electronic element fabricating apparatus of a conventional art is used to laminate two samples desired to be compressed on a lower base in a vacuum chamber at atmospheric pressure and maintain the vacuum state and then vertically move them through a movable member, before the vacuum state is established, a part of the two samples are compressed by force imposed by the weight, and results in trapping of air. The phenomenon of trapping air in the process of compressing two layers increases from high vacuum to an atmospheric environment. The trapped air at the interface moves over time.

Also, in the conventional art, air-bulging occurs in the vacuum environment after the stretched film of PDMS (polydimethylsiloxane) is applied to a silicon wafer (Si-WF) at atmospheric pressure. Further, when the trapped air is maintained in a vacuum environment, after a VHB (very high bond) stretchable substrate is attached to a stretchable jig unit at atmospheric pressure, the air may swell. This air swelling increases when the stretchable substrate has a lower Young's modulus, and the air swelling phenomenon becomes larger at a constant stress in the vacuum chamber. In the silicon wafer and/or PDMS interface, elliptical bubbles are formed, but the stretchable jig and/or VHB interface forms circular bubbles. This phenomenon is caused by the difference in strain rate at the same pressure of the stretchable substrate.

On the other hand, if the Young's modulus is very high, this bulging phenomenon is not observed. There is a method to form many holes in the stretchable substrate to prevent these bubbles from forming, but the bubbles are not quickly removed under the vacuum. If a very high vacuum condition (e.g., an ultra-vacuum condition) is maintained to remove bubbles quickly, the bubbles will pop and deteriorate the surface roughness of the interface.

If air-bulging occurs at the interface during the transfer of the electronic element onto the stretchable substrate, cracking or delamination of the interface may be induced. Due to such air-bulging, cracking, delamination, and surface roughness deterioration phenomena occurring in such a bonding interface, and a long-range order deformation of the bonding interface occurs in the bonding surface, so that original functionality of the stretchable substrate electronic element would be deteriorated, and the electrical characteristics of the particularly stretchable electronic element are deteriorated. In addition, when an air-trapped electronic element is subjected to a subsequent process such as heat treatment, UV curing, or vacuum processing, the electrical characteristic of the electronic element of the ultra-thin film may be destroyed by air-bulging at the interface.

Therefore, there is a need for a method and apparatus for fabricating stretchable electronic elements to minimize air-bulging in transferring electronic elements onto stretchable substrates.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide method and apparatus for fabricating a stretchable electronic element having advantages of solving air-bulging at interface between two films.

An apparatus for fabricating stretchable electronic elements according to the present invention includes: a chamber; a plurality of sample portions loaded into the chamber and spaced apart from each other, while the chamber is maintained at atmospheric pressure; and a movable member moving the plurality of sample portions and compressing each of the plurality of sample portions together, while the chamber is kept under vacuum.

The apparatus further includes a plurality of vacuum chucks to load the plurality of sample portions, and configured to remove air in the chamber to maintain a vacuum state in the chamber.

The plurality of sample portions include an upper sample portion, a middle sample portion, and a lower sample portion spaced apart from each other in a first axis direction, and further including a stretchable jig unit configured to extend the middle sample portion in a second direction orthogonal to the first axis direction, prior to compressing the plurality of sample portions together by the movable member.

The stretchable jig unit is radially formed to radially stretch the middle sample portion.

The upper sample portion is compressed to a first region of the middle sample portion, and includes a support film configured to induce a pattern of a second direction in a second region of the middle region which is a region other than the first region.

The pattern of the second direction includes a planar structure or a buckling structure.

The support film includes a buckling support film, and the buckling support film includes a glass film, a ceramic film, a metal thin film, or a plastic film.

The support film is shaped as a circular cylinder, a triangular column, a quadrangular column, or a cone with the central part cut off.

A Young's modulus of the support film is at least 0.1 MPa.

The upper sample portion is disposed on the support film, and includes a first pressure dispersion layer configured to uniformly disperse pressure of the upper sample portion to the middle sample portion through the support film.

The middle sample portion includes an adhesive film, and a first release film patterned on the adhesive film to block the adhesive film from the first pressure dispersion layer and protect the adhesive film from the first pressure dispersion layer.

The movable member compresses the plurality of sample portions under pressure of $10^{-2}$ MPa to $10^6$ MPa.

The lower sample portion includes: an electronic element; a second pressure dispersion layer disposed under the electronic element, and constantly dispersing pressure by the lower sample portion to the middle sample portion through the electronic element; and a second release film disposed between the second pressure dispersion layer and the electronic element to block the second pressure dispersion layer from the adhesive film and protect the adhesive film from the second pressure dispersion film.

The lower sample portion includes a heat-resistant substrate configured to support the electronic element, and a sacrificial film disposed between the heat-resistant substrate and the electronic element, and configured to support the electronic element.

The thickness of the heat-resistant substrate is between 100 nm and 1000 μm.

The apparatus further includes a plurality of other electronic elements different from the electronic element, wherein the electronic element and the plurality of other electronic elements are disposed in a vertical structure, a parallel structure, a tandem structure, or a composite structure.

A method for fabricating a stretchable electronic element, including: loading an upper sample; loading a lower sample under the upper sample; loading a middle sample between the upper sample and the lower sample; stretching the middle sample; maintaining vacuum by removing air between the upper sample and the middle sample, while maintaining a distance between the upper sample and the middle sample; moving the upper sample to the middle sample while maintaining the vacuum to uniformly compress the upper sample to the middle sample; maintaining the vacuum by removing air between the lower sample and the middle sample while maintaining a distance between the lower sample and the middle sample; and moving the compressed upper and middle samples to the lower sample, while maintaining the vacuum, and uniformly compressing the middle sample to the lower sample.

The upper, middle, and lower samples are spaced in a first direction, and stretching the lower sample includes stretching the lower sample in a second direction orthogonal to the first direction.

The method further includes releasing the stretched lower sample to generate a pattern of the second direction in a first region of the middle sample.

The loading the lower sample under the upper sample includes loading a support film compressed to a second region of the middle region different from the first region, and inducing a pattern in the second region in the second direction.

DETAILED DESCRIPTION OF THE EMBODIMENTS

Figure 1:
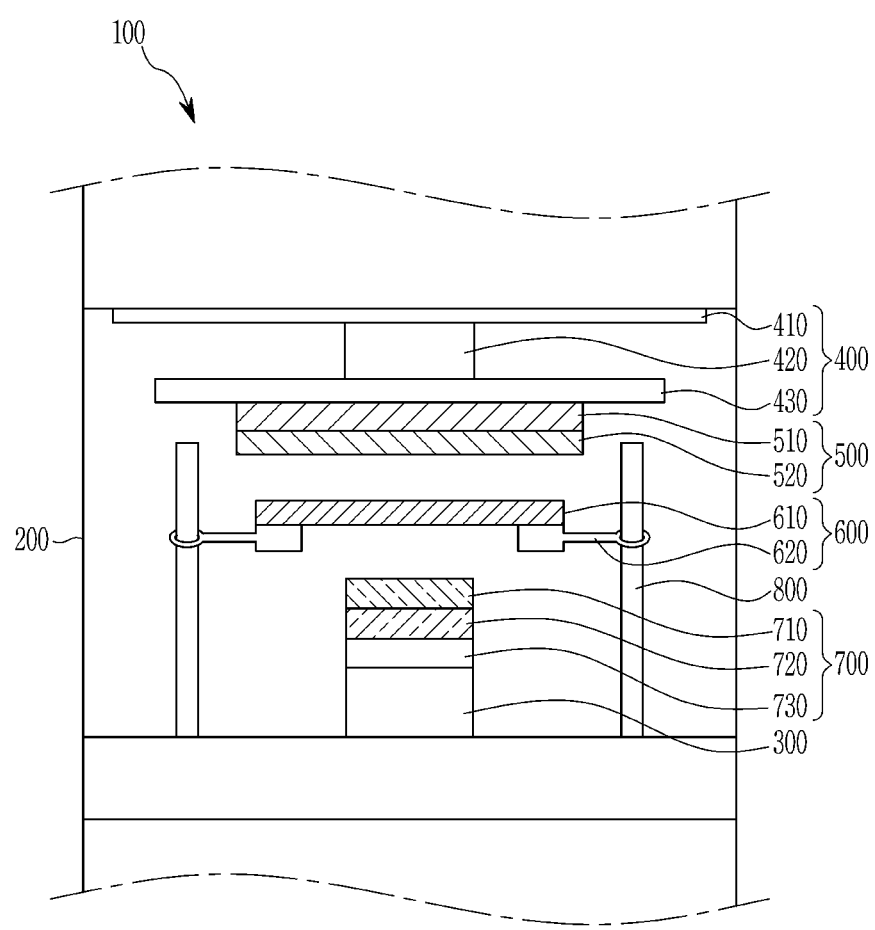
FIG. 1 shows a schematic representation of a vacuum stretchable electronic element fabricating apparatus according to an exemplary embodiment of the present invention for uniform compressing.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Referring to FIG. 1, a stretchable electronic element fabricating apparatus (a vacuum laminator for uniform compressing, hereinafter referred to as a "stretchable electronic element fabricating apparatus") for uniform compressing in a vacuum state according to an exemplary embodiment of the present invention will be described.

FIG. 1 shows a schematic representation of a vacuum stretchable electronic element fabricating apparatus according to an exemplary embodiment of the present invention for uniform compressing.

As shown in FIG. 1, a stretchable electronic element fabricating apparatus 100 according to an exemplary embodiment of the present invention includes a vacuum chamber 200, a stage 300, a moving unit 400, an upper sample unit 500, a middle sample unit 600, a lower sample unit 700, and a mounting table unit 800.

The vacuum chamber 200 may create an atmospheric pressure or vacuum state in the internal space. The stretchable electronic element fabricating apparatus may fabricate stretchable electronic elements from atmospheric pressure to a vacuum environment of $10^{-10}$ torr, a temperature environment of −10° C. to 300° C., and a compression environment of $10^{-2}$ MPa to $10^6$ MPa.

The stage 300 may be disposed at a bottom of an inner space of the vacuum chamber 200. The stage 300 may have a shape similar to that of the sample unit, for example, a flat quadrangle shape. Above the stage 300, a heating unit 730 and a lower vacuum chuck 720 may be fixed in order.

The moving unit 400 may include a horizontal movable member 410, a vertically movable member 420, and a fixed body 430. The horizontal movable member 410 and the vertically movable member 420 may move the upper sample unit 500 in the horizontal direction and the vertical direction. The fixed body 430 may support the upper sample unit 500, and may transfer the upper sample unit 500 into or out of the vacuum chamber via the horizontal movable member 410 and the vertically movable member 420.

The upper sample unit 500 may include an upper vacuum chuck 510 and an upper sample portion 520. The upper sample portion 520 may be compressed to the upper vacuum chuck 510 in the vacuum state and may be separated from the upper vacuum chuck 510 with the vacuum released.

The middle sample unit 600 may include a middle sample portion 610 and a stretchable jig unit 620. As an example, a middle sample portion 610 may include a stretchable substrate. The middle sample portion 610 may be located at an upper side of the stretchable jig unit 620, and may be stretched in one axis (x axis or y axis) direction, two axis directions (two axes of the x axis and the y axis), or a radial direction, respectively. The middle sample portion 610 may be stretched from 0% to 300% relative to an original length ratio in the x axis, y axis, and radial directions.

A lower sample portion 710 may be disposed on the lower vacuum chuck 720. The heating unit 730 may transfer heat from −10° C. to 400° C. to the lower sample portion 710. The lower sample portion 710 may be compressed to the lower vacuum chuck 720 in the vacuum state, and be separated from the upper vacuum chuck 510 in the vacuum released state.

The mounting table unit 800 may support the middle sample unit 600 on the upper side. The mounting table unit 800 may be moved up and down along a rod-shaped guide line. The mounting table unit 800 may support two or more edges of the middle sample portion 610 in a line shape, and may be disposed to enclose all edges of the middle sample portion 610 in a closed-loop (or closed line) shape. The mounting table unit 800 may align the upper sample portion 520, the middle sample portion 610, and the lower sample portion 710. The mounting table unit 800 may fix the upper sample portion 510, the middle sample portion 610, and the lower sample portion 710 to prevent the upper sample portion 510, the middle sample portion 610, and the lower sample portion 710 from moving, while the upper sample unit 500, the middle sample unit 600, and the lower sample unit are heated and pressed.

Figure 2:
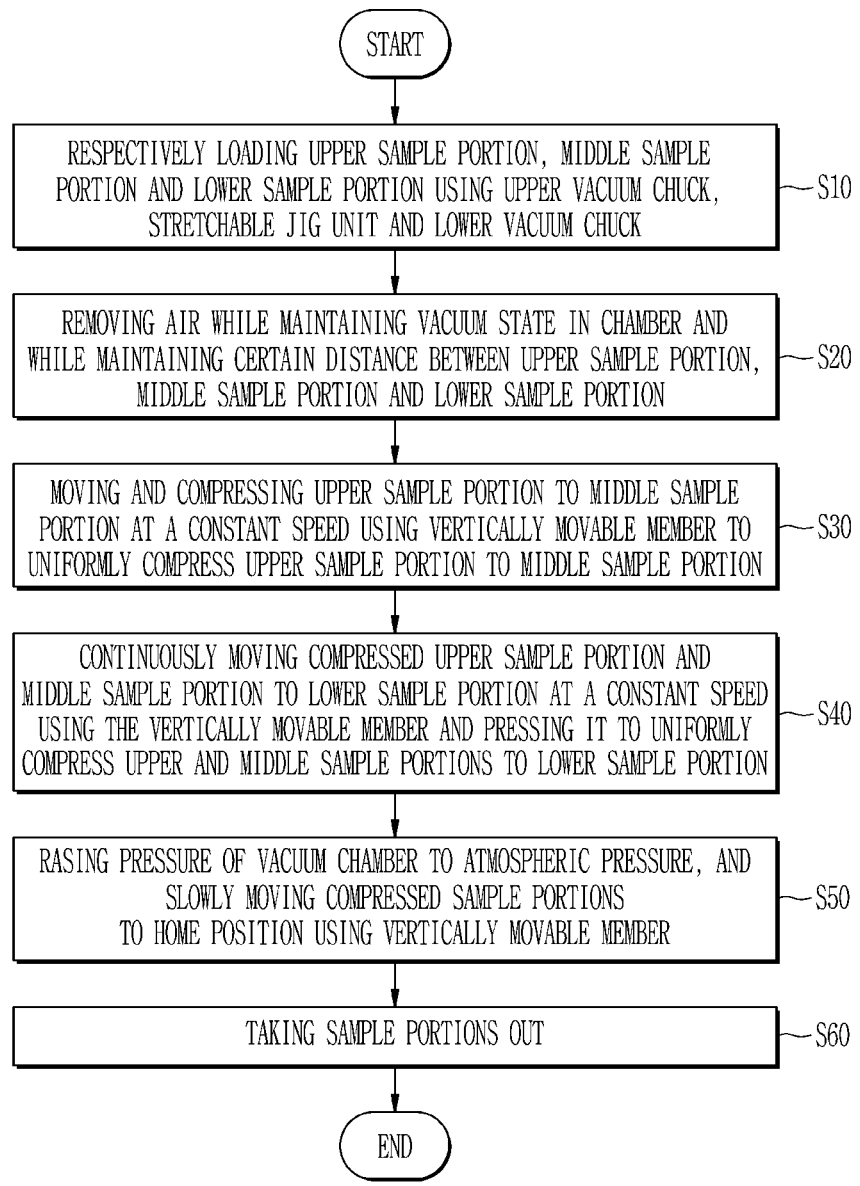
FIG. 2 shows a flowchart for a method of fabricating a stretchable electronic element in a vacuum stretchable electronic element fabricating apparatus according to an exemplary embodiment of the present invention.

FIG. 2 shows a flowchart for a method of fabricating a stretchable electronic element in a vacuum stretchable electronic element fabricating apparatus according to an exemplary embodiment of the present invention.

According to an exemplary embodiment of the present invention, the vacuum stretchable electronic element fabricating method may include S10 to S60 steps.

The vacuum stretchable electronic element fabricating method includes loading the upper sample portion 520 on the upper vacuum chuck 510 using the moving unit 400, loading the middle sample portion 610 on the stretchable jig unit 620, and loading lower sample portion 710 on the lower vacuum chuck 720, respectively (S10).

The vacuum stretchable electronic element fabricating method includes forming a vacuum in the vacuum chamber 200 through the upper vacuum chuck 510 and the lower vacuum chuck 720, and removing air between the upper, middle, and lower sample portions 520, 610, and 710 while maintaining a constant distance between the upper, middle, and lower sample portions 520, 610 and 710 (S20).

The vacuum stretchable electronic element fabricating method may include moving and compressing the upper sample portion 520 to the middle sample portion 610 at a constant speed using the vertically movable member 420 to uniformly compress the upper sample portion 520 to the middle sample portion 610 (S30).

The vacuum stretchable electronic element fabricating method may include continuously moving the compressed upper sample 520 and the middle sample portion 610, which are combined using the vertically movable member 420, to the lower sample portion 710 at a constant speed using the vertically movable member 420, and compressing the compressed upper sample portion 520 and the middle sample portion 610 to the lower sample portion 710 (S40).

According to an exemplary embodiment of the present invention, in the above steps S30 and S40, the upper sample portion 520 and the lower sample portion 710 may be compressed to the middle sample portion 610 stretched in a direction of a first axis and a second axis by the stretchable jig unit 620.

The vacuum stretchable electronic element fabricating method may include raising the pressure of the vacuum chamber 200 to atmospheric pressure and then slowly moving the compressed sample units back to the home position (original position) using the vertically movable member 420 (S50).

The vacuum stretchable electronic element fabricating method may include taking out the sample portion, removing remaining layers from the upper sample portion 520 and the lower sample portion 710, separating the stretchable element from the middle sample portion, and taking in a new sample portion (S60).

Although not shown in FIG. 2, the sample portions may be moved to the inside and to the outside of the vacuum chamber through a separate movable apparatus.

Figure 3:
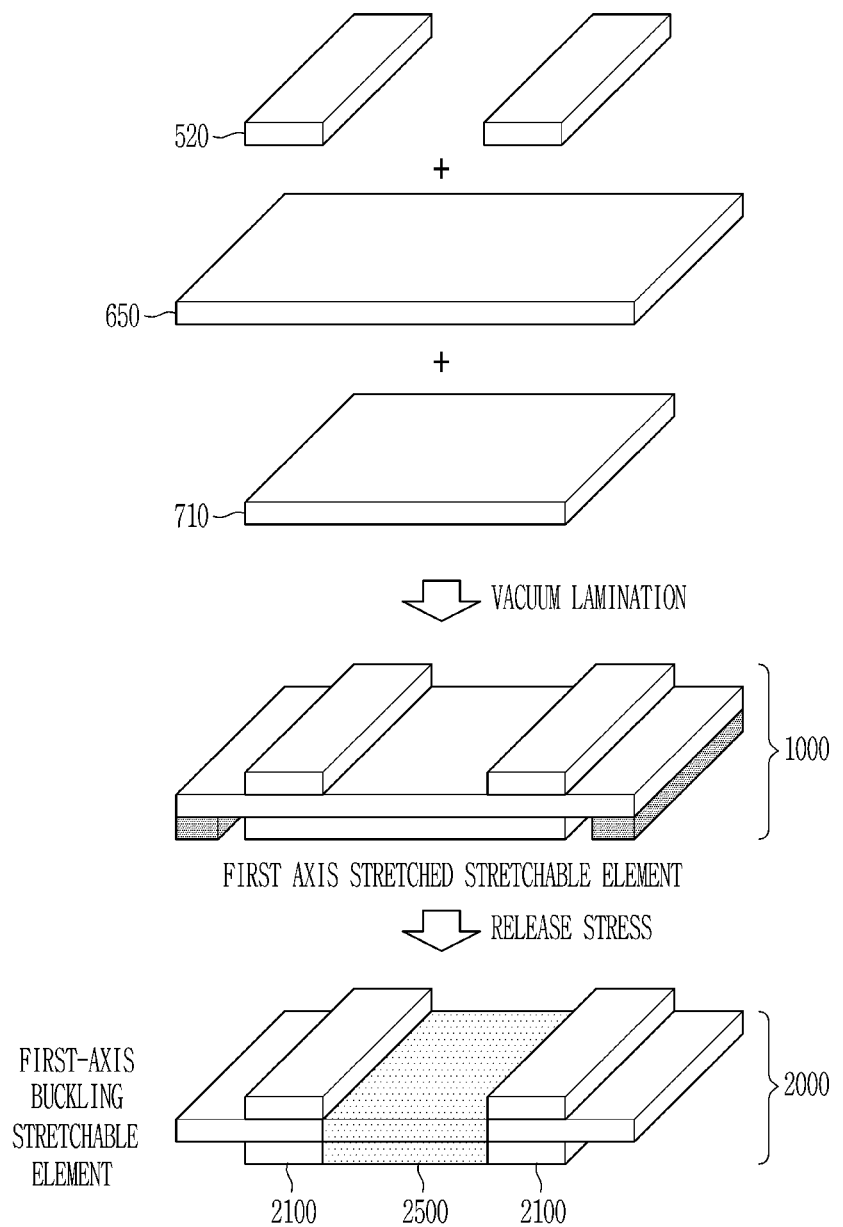
FIG. 3 shows a method for fabricating a stretchable electronic element according to an exemplary embodiment of the present invention including a buckling structure transferred to a first axis-stretched substrate.

FIG. 3 shows a method for fabricating a stretchable electronic element according to an exemplary embodiment of the present invention including a buckling structure transferred to a first axis-stretched substrate.

As shown in FIG. 3, the vacuum lamination compressing process includes a first compression step for compressing the upper sample unit 500 attached on the fixed unit 430 and the upper vacuum chuck 510 to the upper side of a stretchable substrate 650 using the vertically movable member, and a second compression step for compressing the compressed upper sample portion 520 and/or stretchable substrate 650 to the lower sample portion on the direction of basis along with the rod-shaped guide line included in the mounting table 800. The lower sample portion 710 may pass through the stretchable jig unit 620 and be located on the stretchable substrate 650.

The upper sample portion 520 and the lower sample portion 710 are uniformly compressed on both sides of the fixed stretchable substrate 650 in a pre-stretched state by the stretchable jig unit 620, and a stretchable element 1000 stretched in the first axis direction may be fabricated. The stretchable substrate 650 is stretched by a Young's modulus of 0.1 MPa or more to maintain the compression of the upper sample portion 520 and the lower sample portion 710, it may have high adherence on both sides, and a pattern of the upper sample portion may be transferred on the upper side of the upper sample portion 520.

As shown in FIG. 3, the stress of the stretchable substrate 650 may be removed through releasing the stress from the pre-stretchable substrate 650. By releasing the stress of the stretchable substrate 650 into an original state, it is possible to fabricate a first axis buckling stretchable element 2000 including a deformation portion 2500 including a buckling structure of a first axis direction capable of receiving deformation due to an external force between a patterned induced fixing portion 2100 by the compressed upper sample portion 520.

Figure 4:
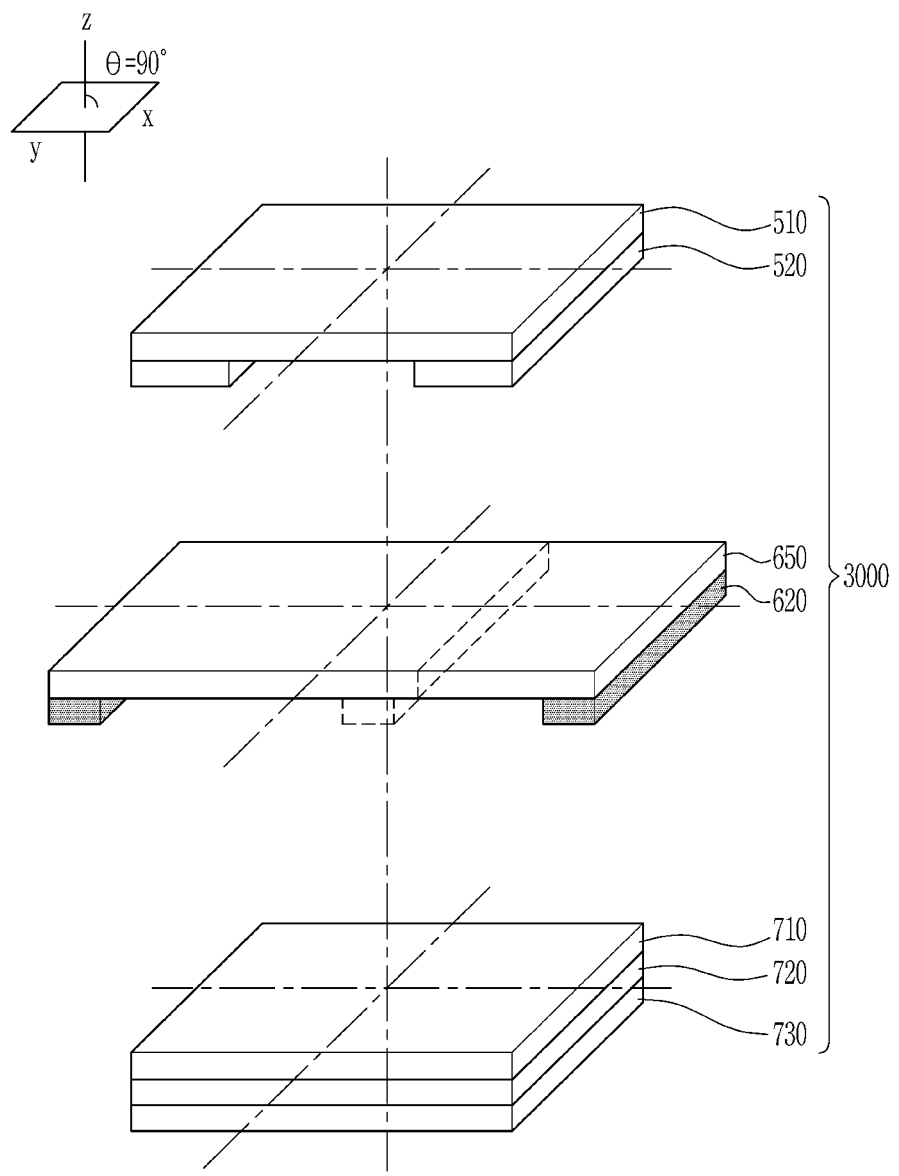
FIG. 4 shows perspective view of an alignment structure of a stretchable electronic element stretched in the first axis direction from the upper, middle, and lower sample units in an apparatus for fabricating a vacuum-stretchable electronic element according to an exemplary embodiment of the present invention.

FIG. 4 shows a perspective view of an alignment structure of a stretchable electronic element stretched in the first axis direction from the upper, middle, and lower sample units in a stretchable electronic element fabricating apparatus according to an exemplary embodiment of the present invention.

As shown in FIG. 4, the upper sample portion 520, the middle sample portion 650, and the lower sample portion 710 stretched in the first axis direction are disposed in parallel on the x-y plane, and an angle between the upper sample portion 520, the middle sample portion 650, and the lower sample portion 710, and the z-axis, may be 90°. The upper sample portion 520, the middle sample portion 650, and the lower sample portion 710 are uniformly compressed in parallel.

Figure 5:
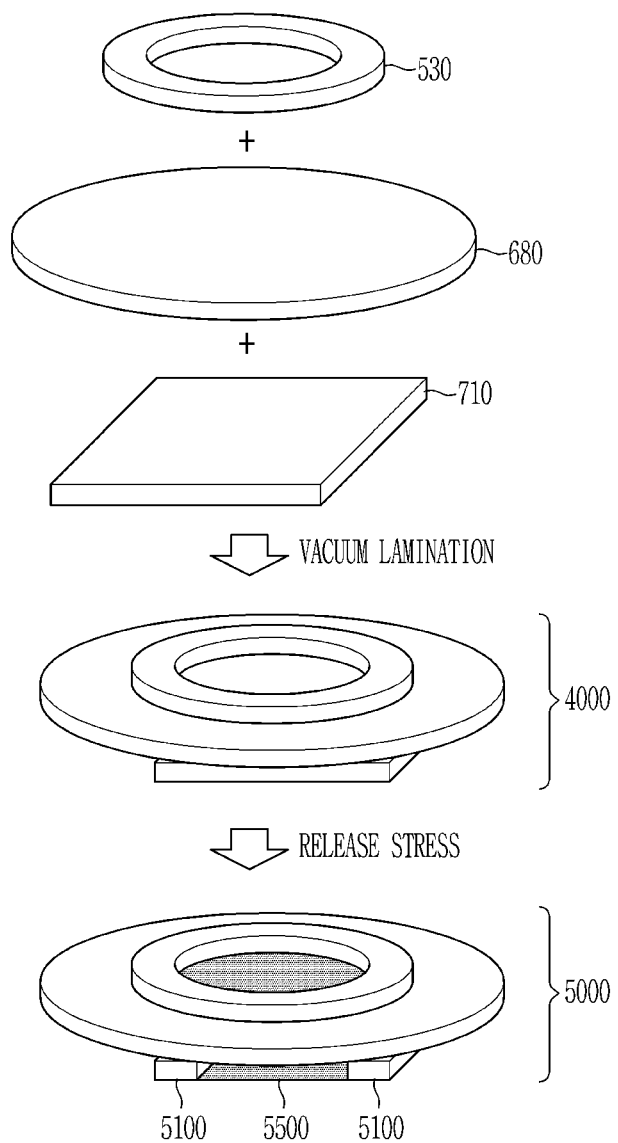
FIG. 5 shows a method of fabricating a stretchable electronic element according to an exemplary embodiment of the present invention including a buckling structure transferred to a radially stretched substrate.

FIG. 5 shows a method of fabricating a stretchable electronic element according to an exemplary embodiment of the present invention including a buckling structure transferred to a radially stretched substrate.

As shown in FIG. 5, an upper sample portion 530 and a lower sample portion 710 are uniformly compressed on both sides of a radially stretched stretchable substrate 680 which has been preliminarily stretched and fixed by a stretchable jig unit 620, and a stretchable element 4000 that is radially stretched may be fabricated by a uniform compressing process. The stretchable substrate 680 is stretched by Young's modulus of greater than 0.1 MPa, and may maintain the compression with the upper sample portion 530 and the lower sample portion 710 through high adherence to both sides. A pattern of the upper sample portion 530 may also be transferred onto the stretchable substrate 680.

Once the radially stretched stretchable element 4000 is fabricated, stress may be removed through releasing the stress from the pre-stretched radially stretched substrate 680. By releasing stress of the stretchable substrate 680 to its original state, a radially buckling stretchable element 5000 may be fabricated including a deformation portion 5500 consisting of a radial direction buckling structure capable of receiving deformation by external force through a patterned induced fixing portion 5100 by the compressed upper sample portion 530.

Figure 6:
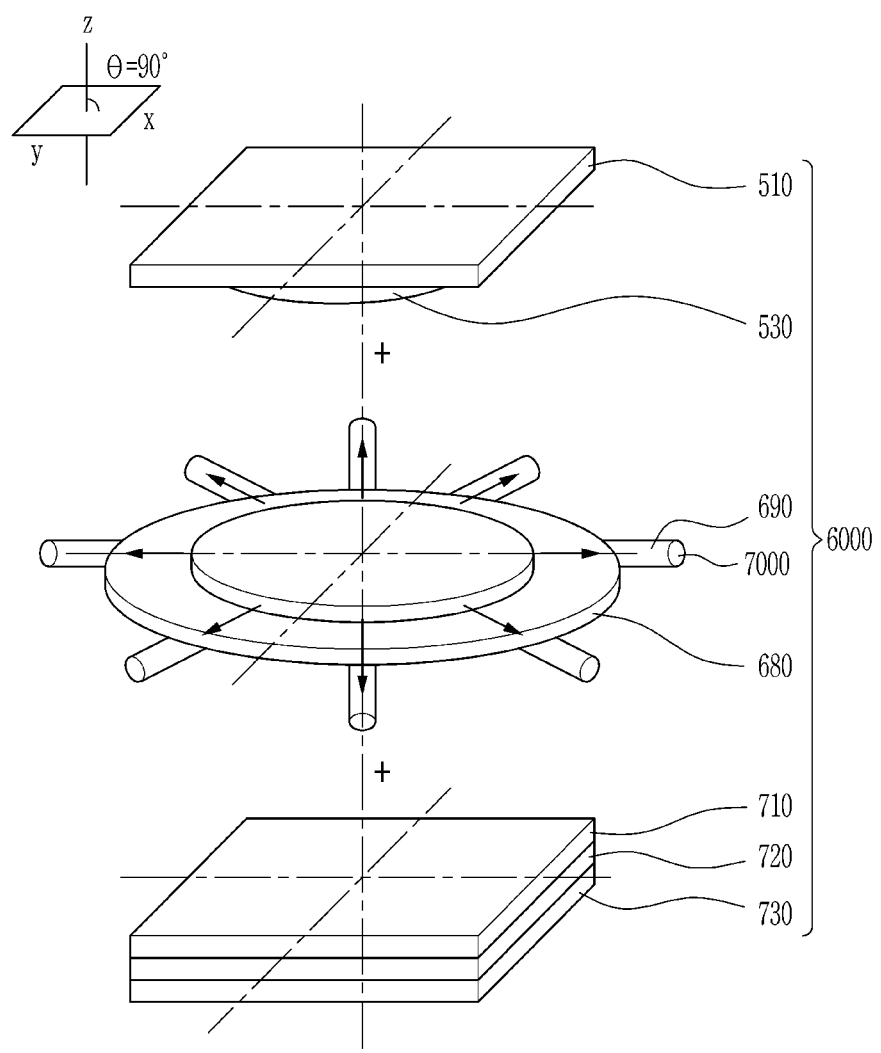
FIG. 6 shows a perspective view of an alignment structure of a stretchable electronic element radially stretched from upper, middle, and lower sample units in an apparatus for fabricating a vacuum-stretchable electronic element according to an exemplary embodiment of the present invention.

FIG. 6 shows a perspective view of an alignment structure of a stretchable electronic element radially stretched from upper, middle, and lower sample units in the stretchable electronic element fabricating apparatus according to an exemplary embodiment of the present invention.

As shown in FIG. 6, the upper sample portion 530, the middle sample portion 610, and the lower sample portion 710 stretched in the first axis direction are disposed in parallel on the x-y plane, and an angle between the z-axis and all of the upper sample portion 520, the middle sample portion 610, the lower sample portion 710 may be 90°. The upper sample portion 520, the middle sample portion 610, and the lower sample portion 710 are uniformly compressed in parallel. A stretchable substrate 680 may be compressed onto a radially stretchable jig unit 690, and the stretchable substrate 680 may stretch uniformly over 6 or more of a plurality of radial stretching axes through a radial stretch screw 7000, so that a radial stretched stretchable substrate 6000 may be fabricated.

Figure 7A:
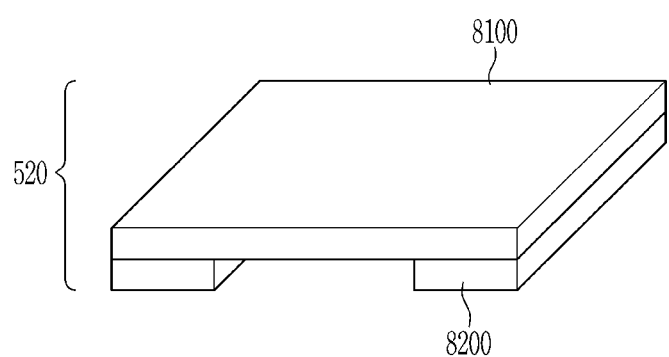
FIG. 7A shows a perspective view of an upper sample portion on a first axis in an apparatus for fabricating a vacuum-stretchable electronic element according to an exemplary embodiment of the present invention.
Figure 7B:
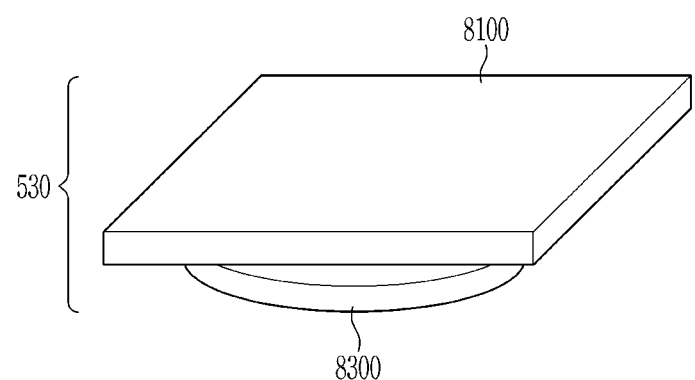
FIG. 7B shows a perspective view of the radially stretched upper sample portion.

FIG. 7A shows a perspective view of an upper sample portion in the first axis in the stretchable electronic element fabricating apparatus according to an exemplary embodiment of the present invention, and FIG. 7B shows a perspective view of the radially stretched upper sample portion.

As shown in FIG. 7A and FIG. 7B, the upper sample portion 520 may include buckling support films 8200 and 8300, and a stretchable pressure dispersion layer 8100 disposed above the buckling support films 8200 and 8300. The buckling support films 8200 and 8300 may be attached to the fixing portion of the stretchable electronic element, so as to pattern the deformation portion that receives external forces in-situ. The stretchable pressure layer 8100 may deliver pressure uniformly to the compressed sample during the compressing process of the lamination process. The buckling support films 8200 and 8300 and the stretchable pressure layer 8100 may consist of films with a large Young's modulus to be easily deformed under constant pressure. The buckling support film may include a glass film, a ceramic film, a metal thin film, or a plastic film having a thickness of 1 μm or more. The buckling support film may be in the form of a circular cylinder, a triangular column, a quadrangular column, or a cone with the central part cut off.

Figure 8A:
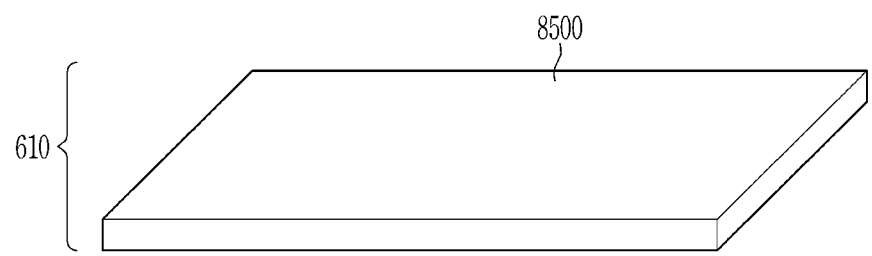
FIG. 8A and FIG. 8B show a perspective view of the middle sample portion in an apparatus for fabricating a vacuum-stretchable electronic element according to an exemplary embodiment of the present invention being stretched on the first axis.
Figure 8B:
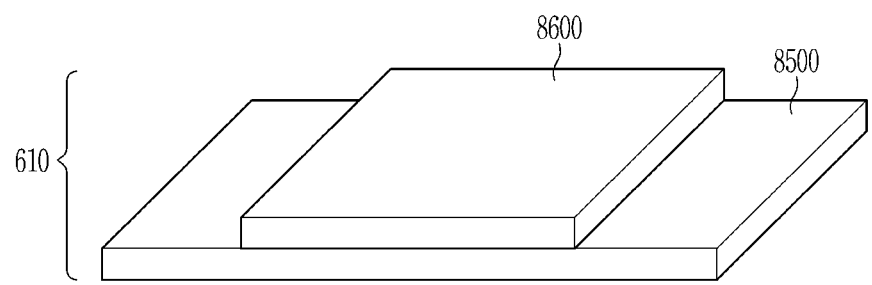
Figure 8C:
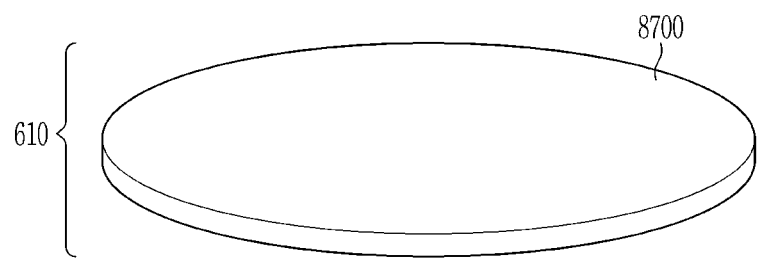
FIG. 8C and FIG. 8D show a perspective view of the radially stretched middle sample portion.
Figure 8D:
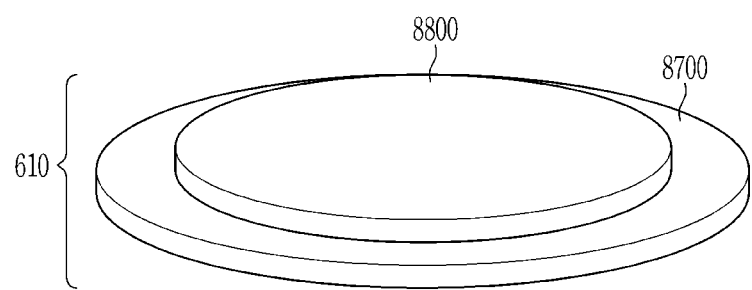

FIG. 8A and FIG. 8B show perspective views of the middle sample portion in the stretchable electronic element fabricating apparatus according to an exemplary embodiment of the present invention being stretched on the first axis, and FIG. 8C and FIG. 8D show perspective views of the radially stretched middle sample portion.

As shown in FIG. 8A, the middle sample portion 610 may include a double-sided highly adhesive stretchable film 8500, and the double-sided highly adhesive stretchable film 8500 is characterized by high adherence, and its Young's modulus is large enough that the stretchability is excellent.

As shown in FIG. 8B, the middle sample portion 610 may include a double-sided highly adhesive stretchable film 8500 and/or a stretchable release film 8600. The stretchable release film 8600 may be patterned on the double-sided highly adhesive stretchable film 8500. An overlap region where the stretchable release film 8600 overlaps the stretchable film 8500 having high adherence may prevent the stretchable substrate from deforming while releasing the stretchable substrate after compressing the stretchable substrate with the stretchable pressure dispersion layer 8100 constituting the upper sample portion 520. For example, very low adherence acts between the stretchable pressure dispersion layer 8100 such as polydimethylsiloxane (PDMS) and the stretchable release film 8600 such as methacryloxypropyl terminated polydimethylsiloxane, so that does not cause damage to the electronic element attached to the highly adhesive stretchable film 8500 in the process of releasing after compressing through the lamination process. On the other hand, the non-overlapped region of the highly adhesive stretchable film 8500, which is the region where the high-adherence stretchable film 8500 does not overlap during the lamination process, may be compressed with the buckling support film including the upper sample portion 520 with high adherence.

As shown in FIG. 8C and FIG. 8D, in the case of the radially stretched stretchable film, the middle sample portion 610 may be composed of a highly adhesive stretchable film 8700 and/or a stretchable release film 8800. The stretchable release film may be patterned on the highly adhesive stretchable film 8700.

Figure 9:
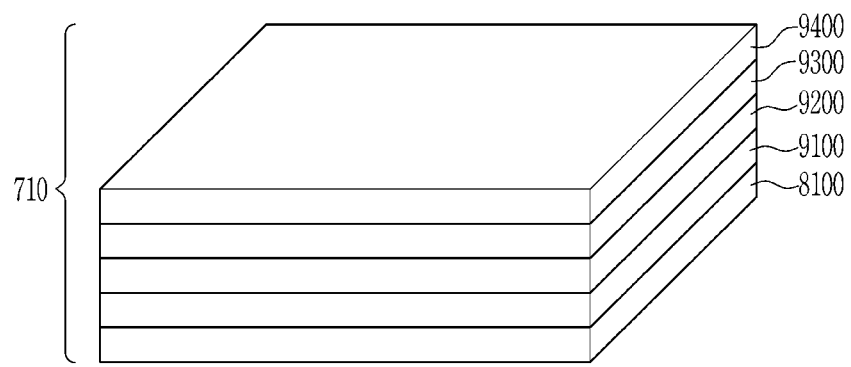
FIG. 9 shows a perspective view of the lower sample portion of a vacuum stretchable electronic element fabricating apparatus according to an exemplary embodiment of the present invention.

FIG. 9 shows a perspective view of the lower sample portion of a vacuum stretchable electronic element fabricating apparatus according to an exemplary embodiment of the present invention.

As shown in FIG. 9, the lower sample portion 710 may include a pressure dispersion layer 8100, a release film 9100, a sacrificial film 9200, an electronic element 9300, and/or a high heat resistant substrate 9400.

The release film 9100 may perform a function such that it does not damage the electronic element while releasing the pressure dispersion layer 8100 from the highly adhesive stretchable film 8500 after compression.

The sacrificial film 9200 may perform functions for supporting the electronic element 9300 when the highly heat resistant substrate 9400 is ultra-thin.

The high heat resistant substrate 9400 has a larger value of Young's modulus than the highly adhesive stretchable film, and may support the electronic element.

The electronic element 9300 may include a vertical structure where the electrodes are disposed in a vertical direction, a tandem structure composed of a plurality of vertical elements which are repeatedly disposed vertically, a lateral structure disposed laterally, and a complex disposed structure.

Figure 10:
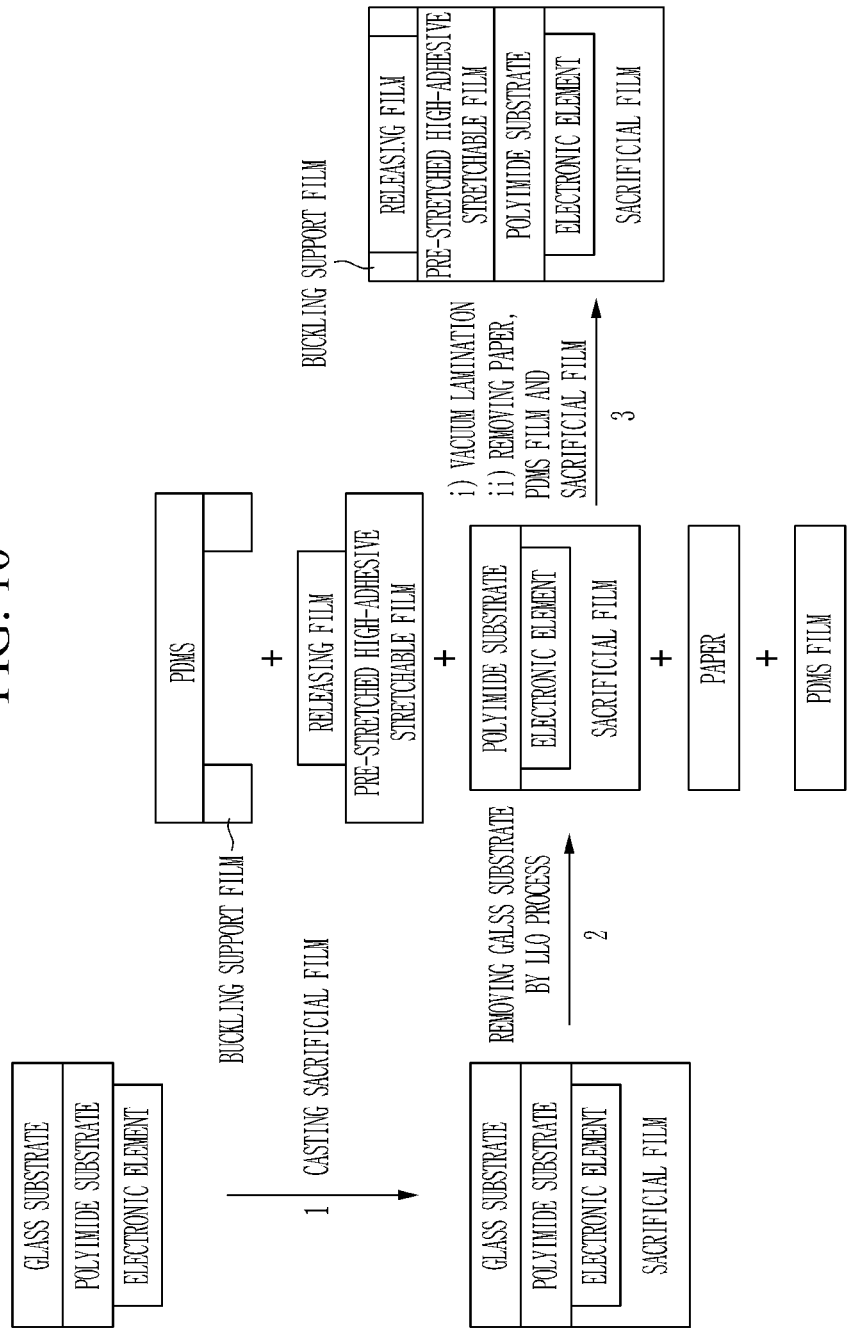
FIG. 10 shows a flowchart illustrating an overall transfer process of a stretchable element having a first axis-stretched buckling structure in a vacuum stretchable electronic element fabricating apparatus according to an exemplary embodiment of the present invention.

FIG. 10 shows a flowchart illustrating an overall transfer process of a stretchable element having a first axis-stretched buckling structure in a vacuum stretchable electronic element fabricating apparatus according to an exemplary embodiment of the present invention.

In a first step of the overall transfer process of the stretchable device, by casting a sacrificial film on a sample including a glass substrate, a polyimide substrate, and an electronic element 9300, a sample of the glass substrate, the polyimide substrate, the electronic element 9300, and the sacrificial film 9200 may be fabricated. The polyimide substrate 9400 may have a higher Young's modulus than the stretchable substrate.

In a second step of the overall transfer process of the stretchable device, by removing the glass substrate from the sample including the glass substrate, the polyimide substrate, the electronic element 9300, and the sacrificial film 9200 through a laser lift-off (LLO) process, a sample including the polyimide substrate, the electronic element 9300, and the sacrificial film 9200 may be fabricated. In this process, the sacrificial film 9200 may perform a function of preventing mechanical damage of the electronic element on the thin film polyimide substrate with a thickness of from 100 nm to 1000 μm.

In a third step of the overall transfer process of the stretchable element, the lower sample portion 710 is laminated in an order of PDMS (polydimethylsiloxane), paper, the sacrificial film 9200, the electronic element 9300, and the polyimide substrate in the vacuum state on the lower vacuum chuck 720 while in a vacuum state, and may be fixed on the lower vacuum chuck 720. The middle sample portion 610, including the double-sided highly adhesive stretchable film with the stretchable release film 8600 patterned on it, may be fixed to the stretchable jig unit 620. The stretchable film 8500 may be pre-stretched. The upper sample portion 520 may be laminated on the upper vacuum chuck 510 in the order of the PDMS and the buckling support film 8200. The PDMS may perform the function of the stretchable pressure dispersion layer 8100.

The upper sample portion 520, the middle sample portion 610, and the lower sample portion 710 are compressed at a specific temperature and a specific pressure through the vacuum lamination process, and an interface of the upper sample portion 520 and the middle sample portion 610 and another interface of the middle sample portion 610 and the lower sample portion 710 may be uniformly compressed. Also, the buckling support film 8200, which constitutes the upper sample portion 520, may serve as the fixing portion 2100 in the stretchable electronic element and pattern the stretchable region. The paper, the PDMS, and the sacrificial film 9200 may be removed after the lamination process. The first axis buckling stretchable element 2000 that may be stretched to the first axis may be fabricated by finishing the above processes.

The region of the deformable portion 2500 located between the fixing portions 2100 in the fabricated first axis buckling stretchable element 2000 may receive the external force, to not affect electrical characteristics of the electronic element in the process of stretching the deformable portion from a planar structure to the buckling structure.

The distance to prevent the electrical characteristics of the first axis buckling stretchable element 2000 from changing depends on a ratio of stretching of the stretchable film 8700 before compressing.

According to an exemplary embodiment of the present invention, a variety of stretchable electronic elements including organic light-emitting devices, solar cells, thin-film transistors, sensors, and touch devices may be fabricated.

Also, according to an exemplary embodiment of the present invention, it is possible to fabricate stretchable electronic elements being applied to electronic skin simulating human touch/texture, input/output devices sensing touch/texture, and interface-related technology realizing/virtualizing the five senses.

Further, according to an exemplary embodiment of the present invention, it is possible to fabricate a stretchable electronic element acting as a UI/UX interface to communicate with humans and devices, and being applied to virtual remote realistic input/output devices, humanoid electronic skin, virtual tactility, and human-friendly electronic skin related techniques.

In addition, according to an exemplary embodiment of the present invention, it is possible to fabricate a stretchable electronic element forming uniform compression at each interface by a first step of removing air in the vacuum environment while spacing a buckling support film, a pre-stretched high-stretchable substrate, and an electronic element apart from one another, and a second step of compressing while applying pressure.

According to an exemplary embodiment of the present invention, patterning a stretchable region that is stretchable within predetermined stress is performed through a lamination process in which compressing a pre-patterned and pre-stretched buckling support film on a stretchable substrate having high adherence is performed in a vacuum state, so that the patterned buckling film forms a fixing portion in a pre-stretched highly adhesive stretchable film, and it is possible to fabricate a stretchable electronic element which may be deformed in the first axis, second axis, and radial directions under predetermined stress, respectively, through the transformed part determined by the fixing portion, the electronic element, and/or the wiring unit.

Further, according to an exemplary embodiment of the present invention, when compared with electronic elements fabricated on a rigid substrate such as a glass substrate, it is possible to fabricate a stretchable electronic element with electrical, optical, and mechanical characteristics that are not distorted through the transfer process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

100: stretchable electronic element fabricating apparatus
200: vacuum chamber
300: stage
400: movable unit
500: upper sample unit
600: middle sample unit
700: lower sample unit
800: mounting table unit

What is claimed is:

1. An apparatus for fabricating a stretchable electronic element, comprising:
   a chamber;
   an upper sample portion, a middle sample portion, and a lower sample portion loaded into the chamber and spaced apart from each other in a first axis direction, while the chamber is maintained at atmospheric pressure; and
   a movable member moving the upper sample portion and the middle sample portion and compressing each of the upper sample portion, the middle sample portion, and the lower sample portion together, while maintaining a vacuum state in the chamber,
   wherein
   the apparatus further comprises a stretchable jig unit configured to extend the middle sample portion in a second direction orthogonal to the first axis direction, prior to compressing the upper sample portion, the middle sample portion, and the lower sample portion together by the movable member, and
   the upper sample portion is compressed to a first region of the middle sample portion, and includes a support film configured to induce a pattern in a second region of the middle region which is a region other than the first region.

2. The apparatus of claim 1, further comprising
a plurality of vacuum chucks to load the upper sample portion, the middle sample portion, and the lower sample portion, and configured to remove air in the chamber to maintain the vacuum state in the chamber.

3. The apparatus of claim 1, wherein the stretchable jig unit is radially formed to radially stretch the middle sample portion.

4. The apparatus of claim 1, wherein
the pattern includes a planar structure or a buckling structure.

5. The apparatus of claim 1, wherein:
the support film includes a buckling support film, and
the buckling support film includes a glass film, a ceramic film, a metal thin film, or a plastic film.

6. The apparatus of claim 1, wherein
the support film is shaped as a circular cylinder, a triangular column, a quadrangular column, or a cone with the central part cut off.

7. The apparatus of claim 1, wherein
a Young's modulus of the support film is at least 0.1 MPa.

8. The apparatus of claim 1, wherein
the upper sample portion is disposed on the support film, and includes a first pressure dispersion layer configured to uniformly disperse pressure by the upper sample portion to the middle sample portion through the support film.

9. The apparatus of claim 8, wherein the middle sample portion includes
an adhesive film, and
a first release film patterned on the adhesive film to block the adhesive film from the first pressure dispersion layer and protect the adhesive film from the first pressure dispersion layer.

10. The apparatus of claim 9, wherein
the movable member compresses the plurality of sample portions under pressure of $10^{-2}$ MPa to $10^6$ MPa.

11. The apparatus of claim 9, wherein the lower sample portion includes:
an electronic element;
a second pressure dispersion layer disposed under the electronic element, and constantly dispersing pressure by the lower sample portion to the middle sample portion through the electronic element; and
a second release film disposed between the second pressure dispersion layer and the electronic element to block the second pressure dispersion layer from the adhesive film and protect the adhesive film from the second pressure dispersion film.

12. The apparatus of claim 11, wherein the lower sample portion includes:
a heat-resistant substrate configured to support the electronic element, and
a sacrificial film disposed between the heat-resistant substrate and the electronic element, and configured to support the electronic element.

13. The apparatus of claim 12, wherein
a thickness of the heat-resistant substrate is between 100 nm and 1000 μm.

14. The apparatus of claim 11,
further comprising a plurality of other electronic elements different from the electronic element, and
wherein the electronic element and the plurality of other electronic elements are disposed in a vertical structure, a parallel structure, a tandem structure, or a composite structure.

* * * * *